(12) United States Patent
Nishimura et al.

(10) Patent No.: US 11,112,701 B2
(45) Date of Patent: Sep. 7, 2021

(54) CONTROL DEVICE, CONTROL METHOD, LITHOGRAPHIC APPARATUS, METHOD OF MANUFACTURING ARTICLE, AND STORAGE MEDIUM

(71) Applicant: CANON KABUSHIKI KAISHA, Tokyo (JP)

(72) Inventors: Mitsuhide Nishimura, Utsunomiya (JP); Junichi Motojima, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/011,202

(22) Filed: Sep. 3, 2020

(65) Prior Publication Data

US 2021/0088914 A1    Mar. 25, 2021

(30) Foreign Application Priority Data

Sep. 19, 2019   (JP) .............................. JP2019-170166

(51) Int. Cl.
*G03F 7/20* (2006.01)
*H01L 21/67* (2006.01)

(52) U.S. Cl.
CPC .... *G03F 7/70525* (2013.01); *H01L 21/67276* (2013.01)

(58) Field of Classification Search
CPC ............. G03F 7/70725; G03F 7/70525; G03F 7/70766; G03F 7/70491; G05B 2219/45031; G05B 13/048; G05B 11/42; G05B 13/024
See application file for complete search history.

(56) References Cited

U.S. PATENT DOCUMENTS

| | | |
|---|---|---|
| 9,140,997 B2 | 9/2015 | Harayama |
| 2007/0258079 A1 | 11/2007 | Kamidi |
| 2013/0265558 A1 | 10/2013 | Harayama |
| 2019/0339624 A1* | 11/2019 | Yoshida .............. G03F 7/70616 |

FOREIGN PATENT DOCUMENTS

| | | |
|---|---|---|
| JP | S58201113 A | 11/1983 |
| JP | 2011100203 A | 5/2011 |
| JP | 2013218496 A | 10/2013 |

OTHER PUBLICATIONS

Search and Examination report issued Singaporean Appln. No. 10202009135V dated Jul. 5, 2021.

* cited by examiner

*Primary Examiner* — Steven Whitesell Gordon
(74) *Attorney, Agent, or Firm* — Rossi, Kimms & McDowell LLP

(57) ABSTRACT

A control device for performing position control of a control target by imparting a feedforward operation amount to the control target to curb a control deviation even when a continuous target time of the control exceeds an upper limit in a case where the position control is performed by imparting the feedforward operation amount, including at least one processor or circuit configured to function as a determination unit configured to determine whether or not a target time for continuing the control using the feedforward operation amount exceeds a predetermined time, and a correction unit configured to correct the feedforward operation amount to be damped toward an end of the target time in a case where it is determined by the determination unit that the target time has exceeded the predetermined time.

14 Claims, 13 Drawing Sheets

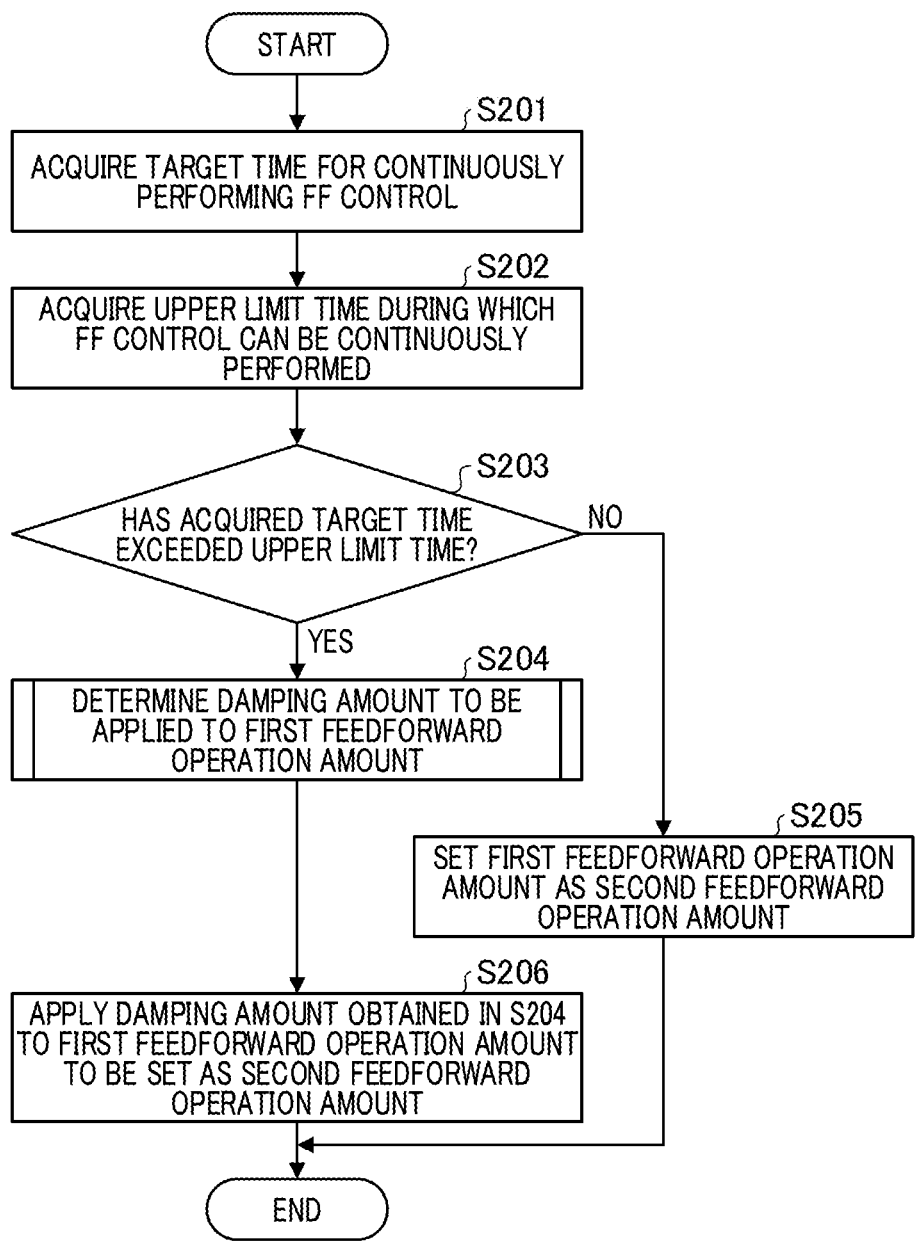

CONTROL DEVICE, CONTROL METHOD, LITHOGRAPHIC APPARATUS, METHOD OF MANUFACTURING ARTICLE, AND STORAGE MEDIUM

FIELD OF THE INVENTION

The present invention relates to a control device, a control method, a lithographic apparatus, a method of manufacturing an article, and the like.

BACKGROUND OF THE INVENTION

For example, in an exposure apparatus used for manufacturing a semiconductor device, it may be advantageous in terms of throughput to quickly reduce a control deviation which occurs when a control target such as a stage which holds an original plate or a substrate is moved to a target position.

In Japanese Unexamined Patent Application, First Publication No. 2013-218496, a response of the substrate stage when a predetermined operation amount such as an impulse signal is imparted to the substrate stage (the control target) is measured. Then, a feedforward (FF) operation amount to be imparted to the substrate stage to reduce a control deviation is generated on the basis of a measurement result.

As described above, a control deviation of a substrate stage moved to a target position can be quickly reduced and a settling time can be shortened by imparting a generated feedforward (FF) operation amount to the substrate stage and controlling a position of the substrate stage.

For example, in an exposure apparatus, there are cases in which a processing time after the movement of the substrate stage is completed is long (200 msec or more). The processing time is determined by an operating method of the exposure apparatus, and cases in which the processing times are long and short may be combined. For example, the exposure amount settings, the alignment settings, and the like are able to handle this.

On the other hand, if the processing time is long, it is desirable to continue in a state in which large FF-controlled control deviations are curbed. That is, in the case in which an FF operation amount is stored, for example, it is necessary to store the number of exposure regions×processing time at the time of exposure and the number of alignment shots×processing time and the FF operation amount at the time of alignment measurement. In an exposure apparatus, since one substrate includes 100 or more shot regions, it is necessary to transfer a mask pattern while moving (scanning) the substrate stage at coordinates of 100 or more different substrate stages. Therefore, when the FF operation amount imparted to the substrate stage differs for each of the coordinates of the substrate stages, the exposure apparatus needs to includes a memory for storing 100 or more kinds of FF operation amounts.

Further, a computer structure of an exposure apparatus is divided into a number of layers, and when the layers are not taken into consideration, it is not difficult to secure a large-capacity memory for storing the FF operation amounts which correspond to the case in which the processing time is long. However, when the layers are taken into consideration, it is difficult to secure a large-capacity memory.

That is, when the processing time is short, a movement time between the coordinates of the substrate stages (including the processing time after movement) is very short (100 msec or less), and during that time, it is difficult to transmit the FF operation amount for a next target position from an upper layer. Therefore, since data required to control the substrate stage is stored in a computer (a memory) of a lower layer, and a memory capacity of the lower layer is limited, at present, it is difficult to store 100 or more kinds of FF operation amounts which correspond to a long processing time.

Moreover, when the layer in which the data is stored is changed according to a length of the FF operation amount, the processing becomes complicated.

Further, when the FF control is stopped, a control deviation occurs for a short time (about 5 msec to 10 msec). The control deviation in that case is, for example, a control deviation (about 5 nm to 100 nm) larger than that in a state in which the FF control is performed.

However, occurrence of a control deviation in the alignment measurement process or the exposure process leads to a decrease in accuracy and a decrease in throughput and thus needs to be avoided.

Therefore, it is an object of the present invention to provide a control device which is able to curb control deviations even when a target time for continuing control exceeds an upper limit in a case in which position control is performed by imparting a feedforward operation amount.

SUMMARY OF THE INVENTION

There is provided a control device for performing position control of a control target by imparting a feedforward operation amount to the control target, including at least one processor or circuit configured to function as a determination unit configured to determine whether or not a target time for continuing the control using the feedforward operation amount exceeds a predetermined time, and a correction unit configured to correct the feedforward operation amount to be damped toward an end of the target time in a case where it is determined by the determination unit that the target time has exceeded the predetermined time.

Further features of the present invention will become apparent from the following description of exemplary embodiments with reference to the attached drawings.

BRIEF DESCRIPTION OF THE DRAWINGS

FIG. 5 is a diagram showing a first operation amount and an output response of the substrate stage of the embodiment, where

FIG. 6 is a flowchart for determining whether or not damping is applied to a first feedforward operation amount according to the embodiment.

FIG. 12 is a diagram showing a control deviation when the FF control is performed on a control target based on the first FF operation amount and the FF control is stopped in the embodiment, where

FIG. 13 is a diagram showing a control deviation when the FF control is performed on a control target based on the second FF operation amount and the FF control is stopped in the embodiment, where

DESCRIPTION OF THE EMBODIMENTS

Figure 1:
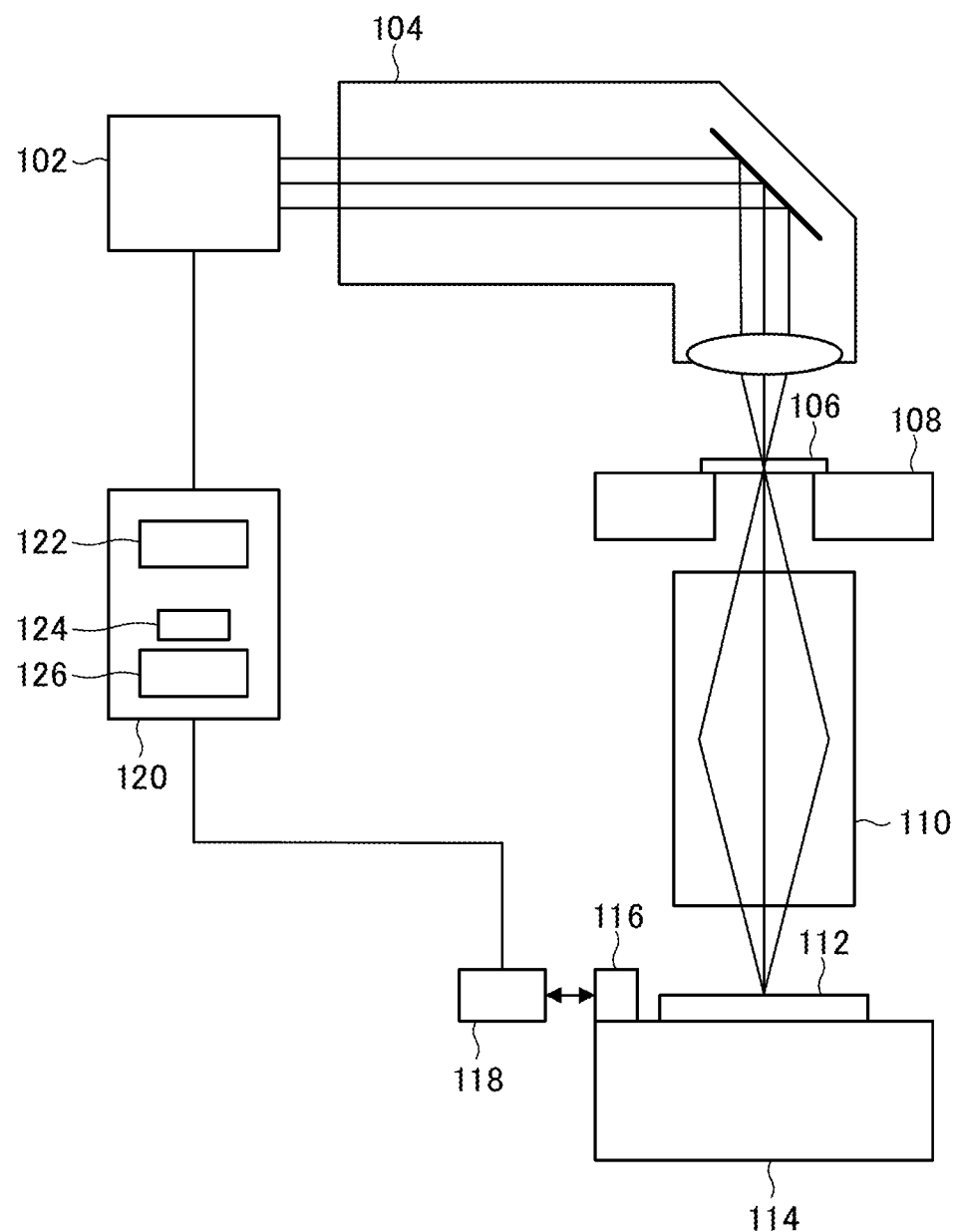
FIG. 1 is a block diagram of an exposure apparatus of an embodiment.

Hereinafter, a preferred embodiment of the present invention will be described using examples with reference to the accompanying drawings. In each of the drawings, the same members or elements are designated by the same reference numerals, and duplicate description thereof will be omitted or simplified. All values described as calculated and stored below are stored in a storage device or in an alternative.

In the following embodiment, the present invention will be described by taking an exposure apparatus which transfers a pattern of a mask (an original plate) onto a substrate as an example, but the present invention is not limited to an exposure apparatus. For example, the present invention can also be applied to other lithographic apparatus such as an imprint apparatus which forms a pattern of an imprint material on a substrate using a mold, or a drawing apparatus which irradiates a substrate with a charged particle beam and forms a pattern on the substrate. Further, the present invention can be applied not only to a lithographic apparatus but also to any apparatus which positions a control target. Furthermore, in the following embodiment, although a substrate stage which holds a substrate and is than movable will be described as the control target, the present invention can also be applied to a case in which a mask stage or the like which holds a mask (an original plate) and is then movable is the control target.

Next, an exposure apparatus according to an embodiment of the present invention will be described with reference to FIG. 1. FIG. 1 is a schematic diagram showing a configuration of the exposure apparatus according to the embodiment. The exposure apparatus is, for example, a static exposure apparatus which transfers a pattern of a mask (an original plate) onto a substrate by a step-and-repeat method. However, the exposure apparatus may be one to which a step-and-scan method or another exposure method is applied.

The exposure apparatus has an illumination optical system 104 which illuminates a mask 106 with light from a light source 102, a mask stage 108 which holds the mask 106, and a projection optical system 110 which projects a pattern of the mask 106 onto a substrate. The exposure apparatus also includes a substrate stage 114 which holds the substrate 112 and is then movable, a movable mirror 116, a laser interferometer 118, and a control device 120.

An i-line light source having a wavelength of about 365 nm, a KrF excimer laser having a wavelength of about 248 nm, an ArF excimer laser having a wavelength of 193 nm, or the like is used as the light source 102. However, the type and number of light sources are not limited, and for example, an F2 laser having a wavelength of about 157 nm may be used as the light source 102.

The illumination optical system 104 is an optical system which illuminates the mask 106 with light from the light source 102. The illumination optical system 104 includes a beam shaping optical system which shapes a shape of the light from the light source 102, an optical integrator which forms a large number of secondary light sources for illuminating the mask 106 with a uniform illuminance distribution, and the like.

The mask 106 has a pattern to be transferred onto the substrate 112 and is held and driven by the mask stage 108. Light diffracted by (the pattern of) the mask 106 is projected onto the substrate 112 via the projection optical system 110. The mask 106 and the substrate 112 are disposed in an optically conjugate relationship. Since the exposure apparatus is a step-and-repeat type exposure apparatus, the substrate stage 114 stands still at each of transfer positions and transfers the pattern of the mask 106 onto the substrate 112.

The mask stage 108 includes a mask chuck for holding (adsorbing) the mask 106 and is configured to be movable in an X-axis direction, a Y-axis direction, a Z-axis direction, and a rotation direction of each of these axes.

The projection optical system 110 is an optical system which projects the pattern of the mask 106 onto the substrate 112. The projection optical system 110 can use a refraction system, a catadioptric system, or a reflection system.

The substrate 112 is a substrate onto which the pattern of the mask 106 is projected (transferred). The substrate 112 is coated with a resist (a photosensitive agent). The substrate 112 includes a wafer, a glass plate, and other substrates.

The substrate stage 114 includes a substrate chuck for holding (sucking) the substrate 112, and has a substrate stage drive unit (not shown) for moving the substrate 112 in the X-axis direction, the Y-axis direction, the Z-axis direction, and the rotation direction of each axis. The movable mirror 116 is fixed to the substrate stage 114, and a position and speed of the substrate stage 114 are detected by the laser interferometer 118 using the movable mirror 116. That is, the laser interferometer 118 can serve as a measurement unit which measures the position and speed of the substrate stage 114. The measurement unit may include a plurality of laser interferometers 118 so that the position and speed of the substrate stage 114 in the X-axis direction, the Y-axis direction, the Z-axis direction, and the rotation direction of each of the axes can be measured.

The control device 120 is configured of, for example, a computer (an information processing device) including a CPU and a memory 126 and controls an operation (an entire operation) of the exposure apparatus 1 based on a computer program stored in the memory 126. For example, the control device 120 controls the position of the substrate stage 114 as the control target. Further, the memory 126 of the control device 120 is a storage unit which stores data related to control of the substrate stage 114. In the embodiment, the memory 126 also stores the feedforward operation amount or the like imparted to the substrate stage 114 by a feedforward controller 124 as described later.

Figure 2A:
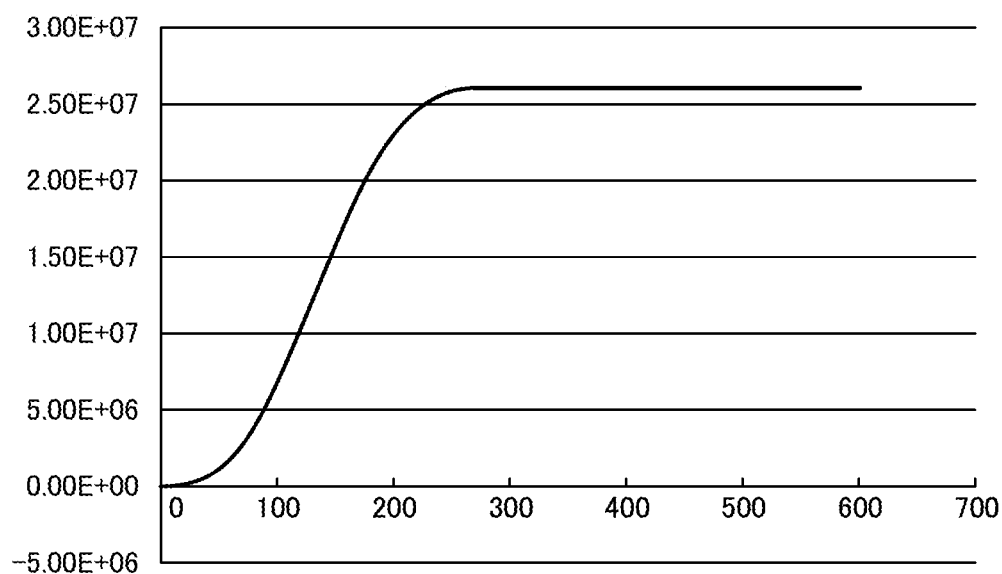
FIG. 2A is a graph showing a position of a substrate stage 114 in a time series manner when only feedback control is performed.
Figure 2B:
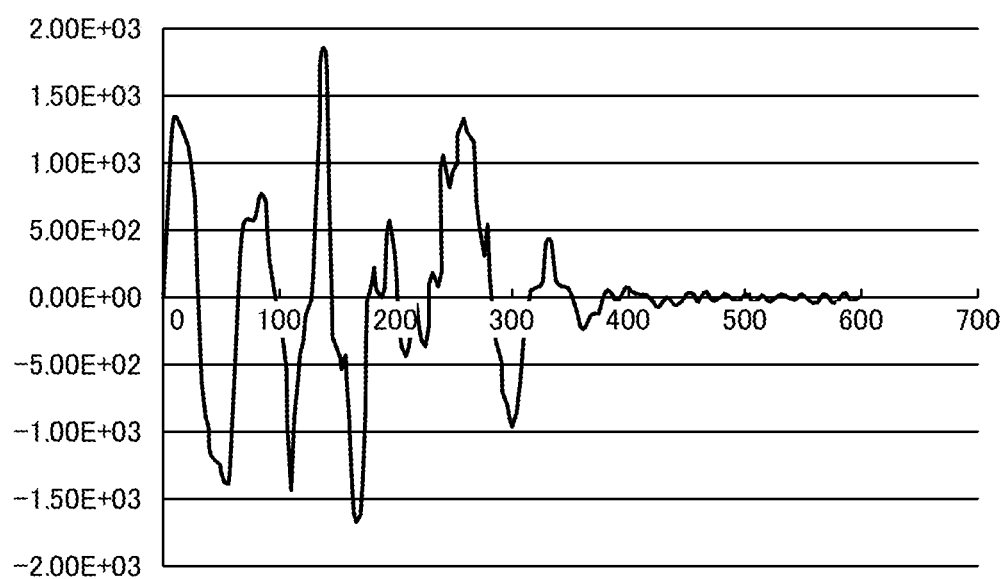
FIG. 2B is a graph showing a position control deviation at that time in a time series manner.

In the exposure apparatus, generally, the feedback control of the substrate stage 114 simply can be performed to reduce the deviation between a current position and a target position of the substrate stage 114. FIG. 2A is a graph showing the position of the substrate stage 114 in a time series manner when only the feedback control is performed, and FIG. 2B is a graph showing a position control deviation (that is, a deviation between the current position and the target position of the substrate stage 114) at that time in a time series manner. In FIG. 2A, a vertical axis represents the position of the substrate stage 114, and a horizontal axis represents time. Further, in FIG. 2B, a vertical axis represents the position control deviation of the substrate stage 114, and a horizontal axis represents time. Hereinafter, the position control deviation of the substrate stage 114 may be simply referred to as a "control deviation".

It can be understood from FIG. 2A that the substrate stage 114 starts moving at time 0 and reaches the target position near time 300. However, as shown in FIG. 2B, a large control deviation of the substrate stage 114 remains in the vicinity of time 300, and it cannot be said that the substrate stage 114 has reached the target position completely. The exposure apparatus for manufacturing a semiconductor device requires nanometer-order accuracy for alignment of the substrate stage. Therefore, in the case of the example in FIG. 2, a time when the exposure process can start is after time 450 when the control deviation of the substrate stage 114 is settled and thus may be disadvantageous in terms of throughput.

Therefore, the control device 120 of the embodiment has a feedback controller (a FB controller) 122 for performing feedback control of the substrate stage 114 (a substrate stage driving unit (not shown), hereinafter, the substrate stage 114 includes the substrate stage driving unit). In addition, a feedforward controller (a FF controller) 124 for performing feedforward control of the substrate stage 114 is included.

The feedback controller 122 feedback-controls the substrate stage 114 to reduce the deviation between the current position (an output response) and the target position (a target value) of the substrate stage 114. The feedforward controller 124 feedforward-controls the substrate stage 114 as the control target to control the position such that a feedforward operation amount is imparted to the substrate stage 114 and the output response of the substrate stage 114 quickly reaches a target value (target data).

Figure 3:
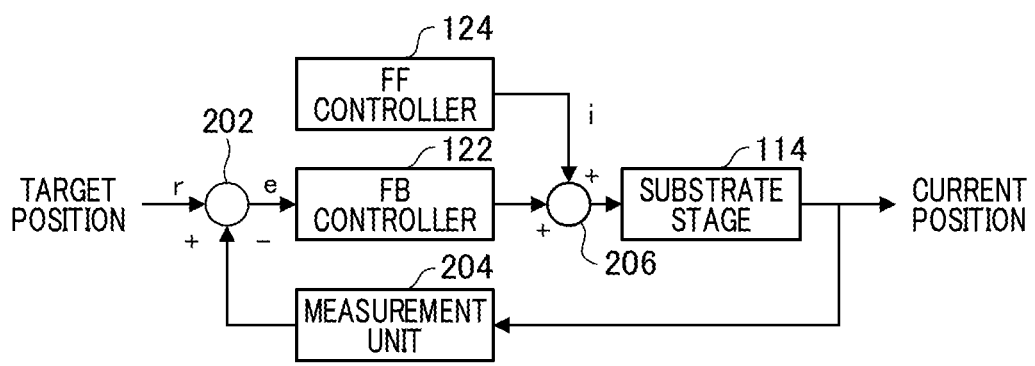
FIG. 3 is a block diagram of position control of the substrate stage of the embodiment.

FIG. 3 is a block diagram of the position control of the substrate stage 114 in the embodiment. A subtractor 202 calculates a deviation e between a current position and a target position r of the substrate stage 114 which is measured by a measurement unit 204 including the above-described laser interferometer 118 and outputs the deviation e to the FB controller 122.

The FB controller 122 includes, for example, a proportional integral differential (PID) compensator, obtains a feedback operation amount for driving the substrate stage 114 to reduce the deviation calculated by the subtractor 202 (for example, to be zero), and imparts the obtained feedback operation amount to the substrate stage 114.

On the other hand, the FF controller 124 adds the feedforward operation amount i for reducing the control deviation of the substrate stage 114 to the feedback operation amount by an adder 206 and supplies an obtained value to the substrate stage 114.

Figure 4:
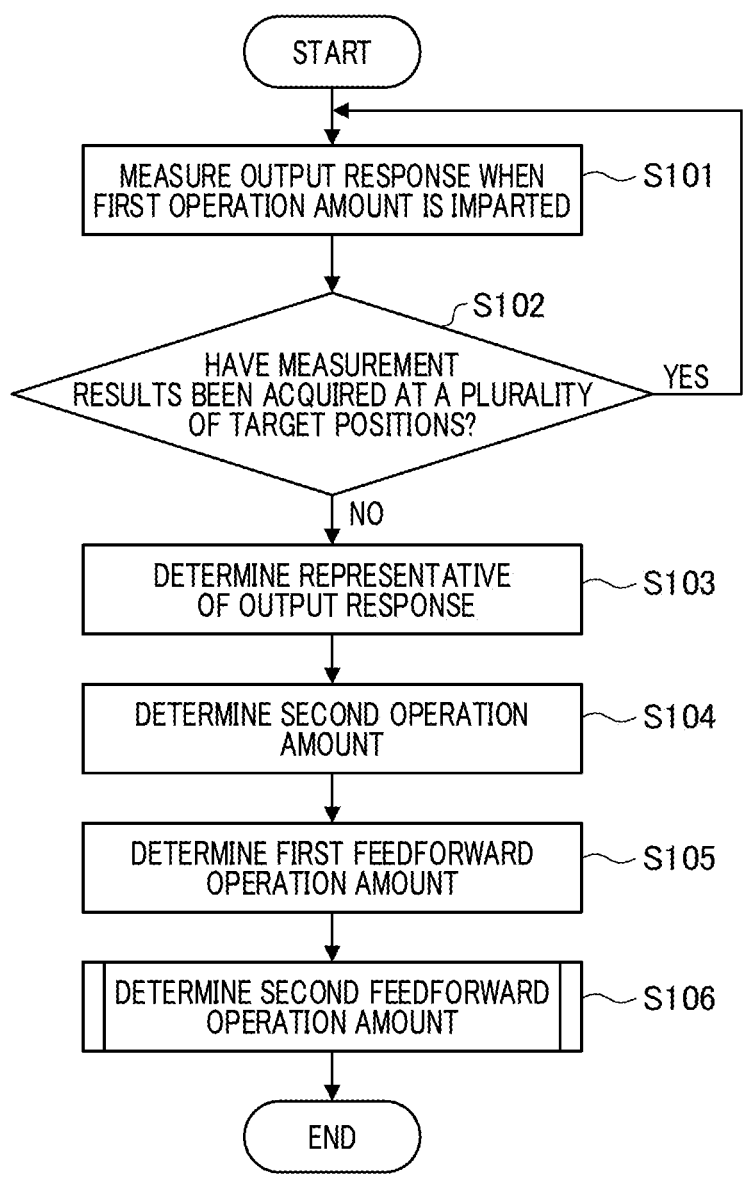
FIG. 4 is a flowchart for determining a feedforward operation amount in the embodiment.

Next, a method of determining the feedforward operation amount imparted to the substrate stage 114 by the FF controller 124 will be described with reference to FIG. 4. FIG. 4 is a flowchart showing the method of determining the feedforward operation amount. Each of processes (steps) in FIG. 4 can be performed by the control device 120 based on a computer program in the memory 126. Hereinafter, the feedforward operation amount may be referred to as "FF operation amount", and the feedback operation amount may be referred to as "FB operation amount".

In S101, the control device 120 measures the output response when a predetermined first operation amount is imparted. Further, in S102, it is determined whether or not a measurement result of the output response of the substrate stage 114 is acquired for each of a plurality of target positions. The target position can be set, for example, to the position at which the substrate stage 114 is to be disposed when the pattern of the mask 106 is transferred to a shot region on the substrate. In this case, a plurality of target positions may be set to include all the positions of the substrate stage 114 when pattern formation is performed on each of a plurality of shot regions on the substrate.

Alternatively, the plurality of target positions may be set to include only the position of the substrate stage 114 when the pattern formation is performed on each of some shot regions (sample shot regions) among the plurality of shot regions on the substrate. When it is determined in S102 that the measurement result of the output response has been acquired for each of the plurality of target positions, the processing proceeds to S103. On the other hand, when there is a target position for which the measurement result of the output response has not been acquired, the processing returns to S101, and the substrate stage 114 is located at the target position to measure the output response.

Figure 5A:
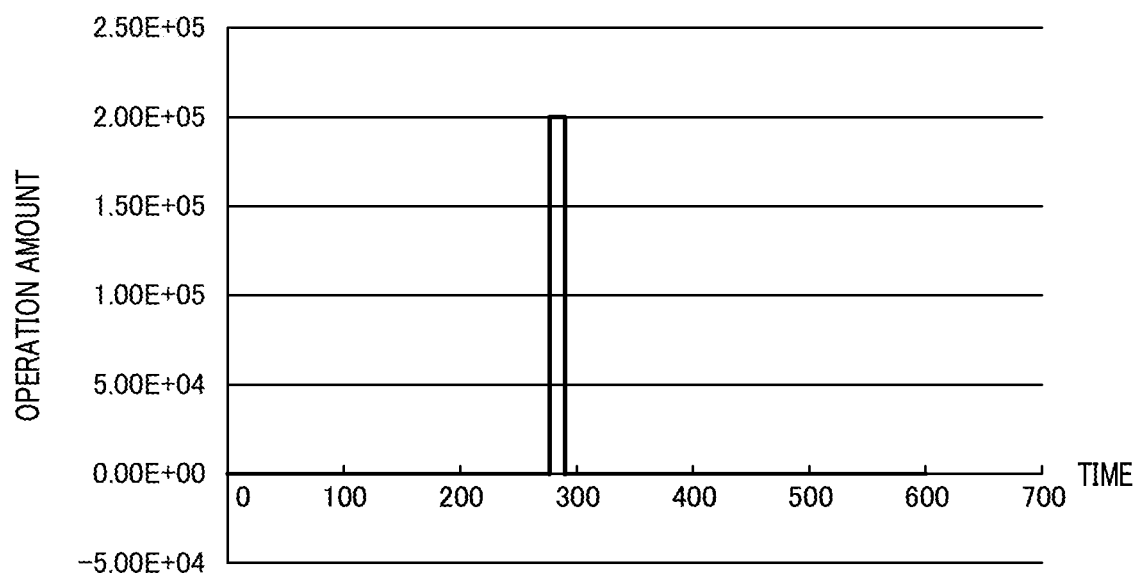
FIG. 5A is a diagram showing an example of an impulse signal.
Figure 5B:
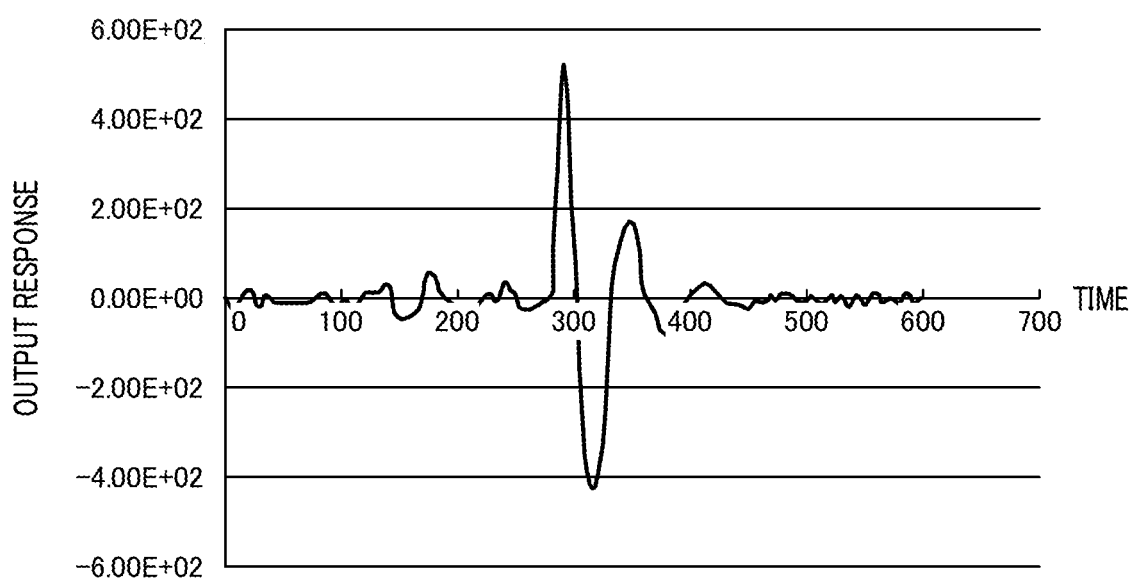
FIG. 5B is a diagram showing a waveform of the output response to the impulse signal of FIG. 5A.

In S103, as shown in FIG. 5B, the control device 120 determines a representative value of the output response when the first operation amount (for example, an impulse signal in FIG. 5A) is imparted to the substrate stage 114 based on the measurement result of the output response acquired at each of the plurality of target positions. In Steps S104 to S106 which will be described later, the control device 120 may set an FF operation amount commonly used at the plurality of target positions and may set an FF operation amount individually for each of the plurality of target positions. When an FF operation amount commonly used at the plurality of target positions is set, the control device 120 can determine an average value (data indicating the average value for each time) of the measurement results of the output response acquired at each of the plurality of target positions as a representative value.

The control device 120 may determine a statistical value such as a maximum value, a minimum value, or a median value of the measurement results as a representative value instead of the average value of the measurement results of the output response. Further, when the FF operation amount is individually set for each of the target positions, the control device 120 may determine the average value or the like of the measurement results of the output response acquired at each of the plurality of target positions as the representative value, or may individually determine the representative value for each of the target positions. For example, the control device 120 may determine (select) the measurement result of the output response acquired at a target position of a target for which the FF operation amount has been determined, among the measurement results of the output response acquired at each of the plurality of target positions, as the representative value.

In S104, the control device 120 determines a second operation amount on the basis of a relationship between the first operation amount (for example, the impulse signal in FIG. 5A) and the representative value of the output response as shown in FIG. 5B determined in S103. The second operation amount is an operation amount obtained by multiplying the first operation amount by a coefficient which may be different at each of a plurality of times and synthesizing (combining) them. The control device 120 estimates the output response of the substrate stage 114, which can be obtained when the second operation amount is imparted to the substrate stage 114, on the basis of an assumption that the first operation amount and the representative value of the output response change in a linear relationship. Then, the second operation amount is determined by performing an approximate calculation which adjusts the coefficient at respective times, such that a difference between the estimated output response of the substrate stage 114 and a target response is within an allowable range (preferably, the difference becomes zero).

The target response is, for example, a control deviation (a graph as shown in FIG. 2B) of the substrate stage 114 with respect to each of the times when only the feedback control is performed. The target response may include the output response (the control deviation) of the substrate stage 114 during a period from an arrival time (time 300 of FIG. 2B) of the substrate stage 114 to the target position to a settling time (time 450 of FIG. 2B) of the substrate stage 114. Further, the target response is not limited to the period from the arrival time to the settling time and may include the output response of the substrate stage 114 in another period.

Here, due to a high frequency component included in the output response (for example, the impulse response of FIG. 5B) of the substrate stage 114 when the first operation amount is imparted, an error may not converge in the approximate calculation when the second operation amount is determined, and the second operation amount may not be obtained normally. In this case, the control device 120 may apply filter processing such that of as a low pass filter, or a window function to the output response of the substrate stage 114.

In S105, the control device 120 determines the first FF operation amount on the basis of the second operation amount determined in S104. For example, the control device 120 determines an operation amount obtained by reversing an operation direction (that is, a direction in which the substrate stage 114 should be driven) in the second operation amount determined in S104 as the first FF operation amount. Since the control deviation of the substrate stage 114 can be reduced (offset) by imparting the first FF operation amount determined in this way to the substrate stage 114 together with the feedback operation amount, the settling time of the substrate stage 114 can be shortened.

A specific method of determining the second operation amount in S104 and setting the first FF operation amount in S105 is described in Japanese Unexamined Patent Application, First Publication No. 2013-218496 and will be described in detail below.

First, a result (an actual measurement value) in which the control deviation e(t) of the substrate stage 114 is measured while the FF operation amount is not imparted to the substrate stage 114 is acquired. Then, a time section (for example, time 331 to time 420) in which the exposure processing is performed is determined, and control deviation data in the time section of the exposure processing is extracted from the control deviation e(t). At this time, assuming that a sampling time is 1, the extracted control deviation data $e_0$ is 90 samples and is represented by the following Equation 1.

$$e_0 = [e_1 e_2 \ldots e_{90}]^T \tag{1}$$

Next, as shown in FIGS. 5A and 5B, the FF operation amount of $\Delta f(t)$ is imparted to the substrate stage 114 at a certain time, and a result (an actual measurement value) in which a response $\Delta y(t)$ thereof is measured is acquired. Then, response data in the time section of the exposure processing is extracted from the response $\Delta y(t)$ of the substrate stage 114.

The response data $y_0$ extracted in this way is as in the following Equation 2.

$$y_0 = [y_{1,0} y_{2,0} \ldots y_{90,0}]^T \tag{2}$$

Although the data up to this point is actual measurement values, virtual data is generated from here. When it is assumed that a similar response is obtained when a similar FF operation amount is imparted to the substrate stage 114 after one sample in which the FF operation amount of $\Delta f(t)$ is imparted, the response is defined as $y_1$. Similarly, when the response after two samples, the response after three samples, . . . , and the response after n samples are $y_2$, $y_3$, . . . , $y_n$, it is represented by the following Equation 3.

$$[y_0 \ y_1 \ \ldots \ y_n] = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \tag{3}$$

When there is a linear relationship between the operation amount imparted to the substrate stage 114 and the response of the substrate stage 114, the response to the FF operation amount $g\Delta f(t)$ is $g\Delta y(t)$. Therefore, when a gain of the FF operation amount after n samples is set to gn, the following Expression 4 is established.

$$[g_0 y_0 \ g_1 y_1 \ \ldots \ g_n y_n] = \begin{bmatrix} g_0 y_{1,0} & g_1 y_{1,1} & \cdots & g_n y_{1,n} \\ g_0 y_{2,0} & g_1 y_{2,1} & \cdots & g_n y_{2,n} \\ \vdots & \vdots & \ddots & \vdots \\ g_0 y_{90,0} & g_1 y_{90,1} & \cdots & g_n y_{90,n} \end{bmatrix} \tag{4}$$

Next, the response of the substrate stage 114 when all the FF operation amounts after n samples are imparted to the substrate stage 114 is estimated. Assuming that the response data in the time section of the exposure processing which is extracted from such a response is Y, Y is a sum of n responses, and thus the following expression 5 is established.

$$Y = \begin{bmatrix} Y_1 \\ Y_2 \\ \vdots \\ Y_{90} \end{bmatrix} = \tag{5}$$

$$\begin{bmatrix} g_0 y_{1,0} + g_1 y_{1,1} + \ldots + g_n y_{1,n} \\ g_0 y_{2,0} + g_1 y_{2,1} + \ldots + g_n y_{2,n} \\ \vdots \\ g_0 y_{90,0} + g_1 y_{90,1} + \ldots + g_n y_{90,n} \end{bmatrix} = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \begin{bmatrix} g_1 \\ g_2 \\ \vdots \\ g_n \end{bmatrix}$$

In order to eliminate the control deviation (the control deviation data $e_0$) in the time section of the exposure processing by imparting the FF operation amount to the substrate stage 114, the response data Y may be equal to the control deviation data $e_0$. Therefore, a gain gn of the FF operation amount can be obtained (determined) using a pseudo inverse matrix as shown in the following Expression 6.

$$e_0 = Y \tag{6}$$

$$\begin{bmatrix} e_1 \\ e_2 \\ \vdots \\ e_{90} \end{bmatrix} = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix} \begin{bmatrix} g_1 \\ g_2 \\ \vdots \\ g_n \end{bmatrix}$$

$$\begin{bmatrix} g_1 \\ g_2 \\ \vdots \\ g_n \end{bmatrix} = \begin{bmatrix} y_{1,0} & y_{1,1} & \cdots & y_{1,n} \\ y_{2,0} & y_{2,1} & \cdots & y_{2,n} \\ \vdots & \vdots & \ddots & \vdots \\ y_{90,0} & y_{90,1} & \cdots & y_{90,n} \end{bmatrix}^{-1} \begin{bmatrix} e_0 \\ e_1 \\ \vdots \\ e_{90} \end{bmatrix}$$

An FF operation amount determined according to the gain in this way, that is, the FF operation amount $gn\Delta f(t+tn)$ obtained by multiplying the determined gain gn by the FF operation amount $\Delta f(t+tn)$ is given to the substrate stage 114. Here, the FF operation amount $gn\Delta f(t+tn)$ corresponds to the second operation amount. Then, the first FF operation amount (the first feedforward operation amount) is determined to offset the deviation with respect to the substrate stage 114 based on this second operation amount.

The embodiment is characterized in that the control deviation when the FF control is stopped is reduced by further applying the damping to the first FF operation amount obtained in S105 toward an end.

That is, in S106, it is determined whether or not the damping has been applied to the first FF operation amount, and the second FF operation amount is determined. Details of a method of determining the second FF operation amount will be described with reference to the flowcharts of FIGS. 6 and 7.

FIG. 6 is a flowchart for explaining a method of calculating the second FF operation amount.

In S201, a target time for continuously performing the FF control is acquired. The target time is determined according to a processing time of the exposure processing, the alignment measurement processing, and the like and is determined according to at least one of a plurality of parameters such as an exposure amount which determines processing conditions and alignment setting.

In S202, an upper limit time during which the FF control of the control device can be continuously performed is acquired. Since a data amount of the FF operation amount increases as the upper limit time becomes longer, the upper limit time is determined in advance according to the memory capacity of the lower layer.

In S203, the target time acquired in S201 and S202 is compared with the upper limit time (a predetermined time).

When the result of comparison is that the target time does not exceed the upper limit time, the first FF operation amount is set as the second FF operation amount.

As a result of the comparison, when the target time exceeds the upper limit time, a damping amount which will be applied to the first FF operation amount is determined in S204. Details of S204 will be described with reference to FIG. 7.

Figure 7:
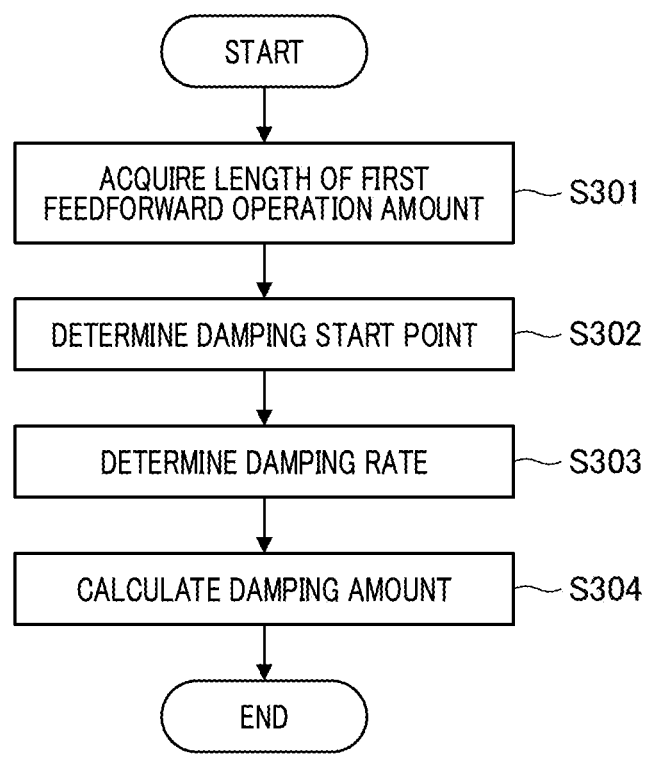
FIG. 7 is a flowchart showing a method of determining a damping amount with respect to the first feedforward operation amount according to the embodiment.

FIG. 7 is a flowchart for explaining a method of determining a damping amount which will be applied to the first FF operation amount.

In S301, a length of the first FF operation amount is acquired. A damping start point S is determined in S302. A damping rate is determined in S303. In S304, a damping amount at each of the times is calculated. As for a method of determining the damping amount at each of the times, any method may be used for calculation as long as it has a characteristic in which damping is performed toward the end of the target time. The first FF operation amounted is corrected by applying such a damping amount thereto, and thus the second FF operation amount is obtained. The feedforward operation amount is corrected to be damped according to the length of the feedforward operation amount.

Regarding a method of calculating the damping amount, an example in which a window function is applied as a damping function is shown below as Equation 7.

In an example below, the length of the first FF operation amount is assumed to be 200 msec.

$$f(t) = \begin{cases} 1, & t < L - (L \times R) \\ \frac{1}{2} \times \left(1 + \cos\left[\frac{C\pi}{R} \times \left(\frac{t}{L} - 1 + R\right)\right]\right), & t \geq L - (L \times R) \end{cases} \quad \text{[Equation 7]}$$

t: Change over time
L: Length of FF operation amount
R: Damping ratio (1−(S/L))
S: Damping start point
C: Curvature coefficient
(provided that, t≠0, L≠0, S≠0, R≠0, C≠0)
also, t=1, 2, 3, . . . n,
when f(n)<f(n+1), 0 is set after f(n).

Figure 8:
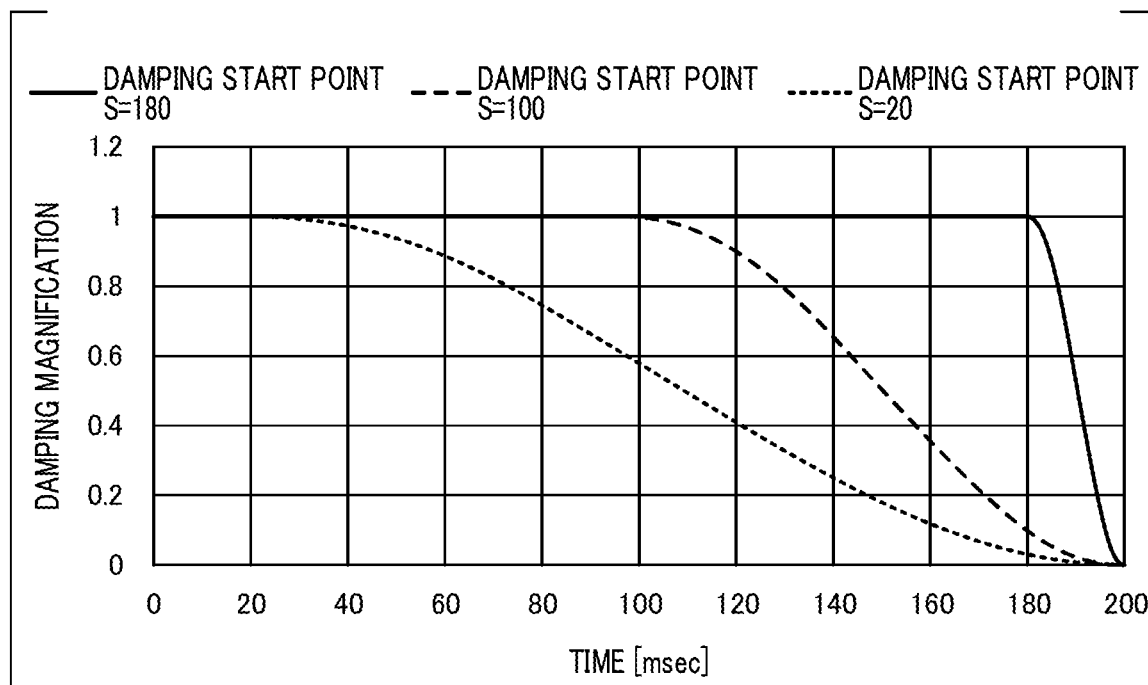
FIG. 8 is a diagram showing change over time of the damping amount by changing a start point of the damping in the embodiment.

FIG. 8 shows a result of calculating change over time of the damping amount when a curvature coefficient C is set to 1.0 and the damping start point S is changed to 180, 100, and 20 msec.

Figure 9:
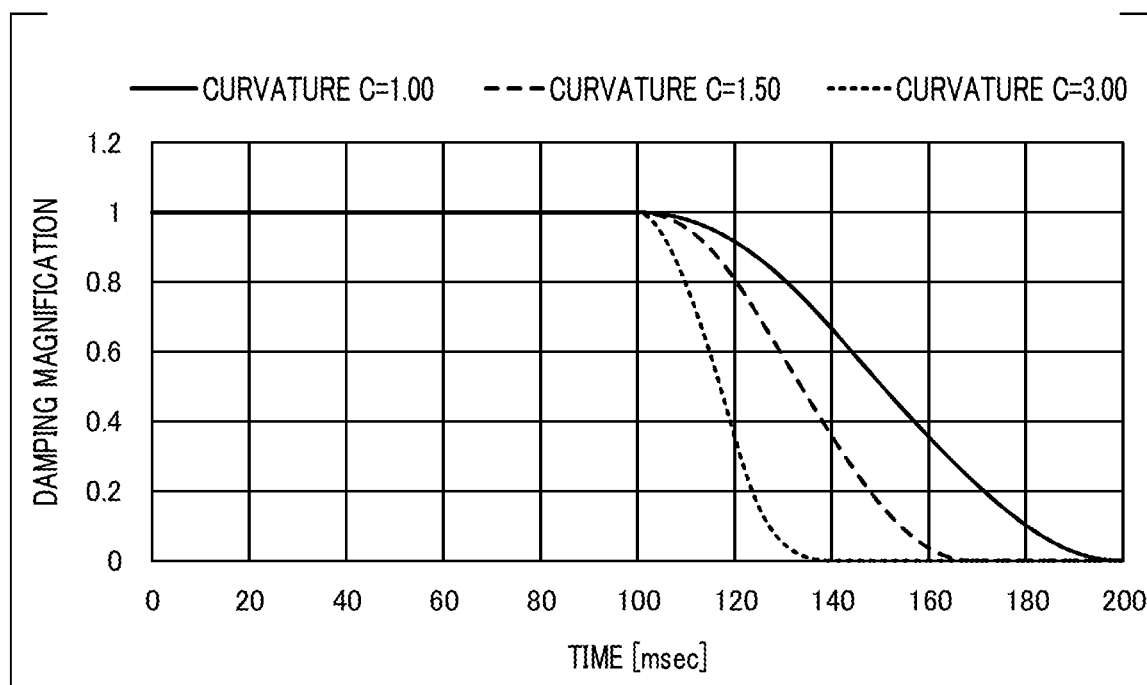
FIG. 9 is a diagram showing change over time of the damping amount by changing a curvature of the damping in the embodiment.

FIG. 9 shows a result of calculating the change over time of the damping amount when the damping start point S is 100 msec and the curvature coefficient C is changed to 1.00, 1.50, and 3.00.

Figure 10:
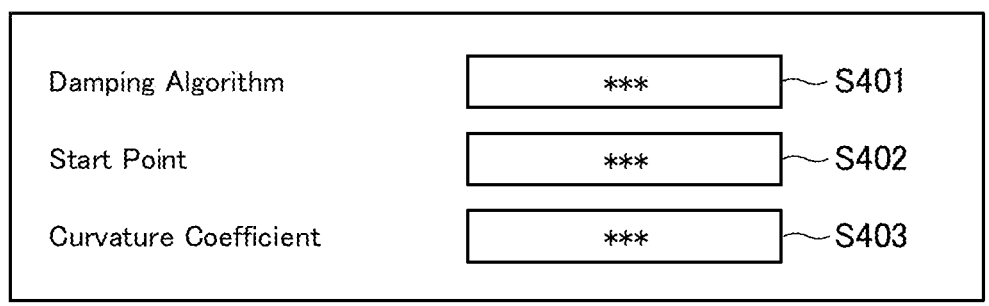
FIG. 10 is a diagram showing a parameter setting screen according to the embodiment.

FIG. 10 shows an example of a parameter setting screen. In FIG. 10, S401 shows a parameter which sets an algorithm for calculating the damping method and can be selected by a user.

S402 shows a parameter which sets the damping start point and can also be selected by the user.

S403 shows a parameter which sets the curvature coefficient and may also be selected by the user or, for example, may be automatically calculated based on the parameters such as S401 and S402.

Returning to FIG. 6, the second FF operation amount is calculated by applying the damping amount determined in S204 to the first FF operation amount in S206 to be corrected. That is, the control device 120 serves as a correction unit by performing a step of S206. Further, as described above, the correction unit can change at least one of the damping start point, the damping rate, and the damping amount of the feedforward operation amount. FIG. 11 shows the damping amount and each of the operation amounts.

Figure 11A:
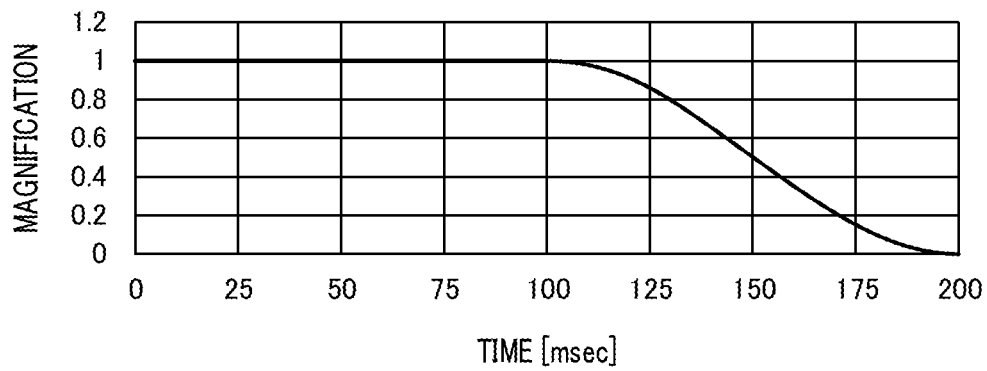
FIG. 11A is a diagram showing a calculated damping amount with a curvature of 1.00 and a damping start point S of 100 msec.
Figure 11B:
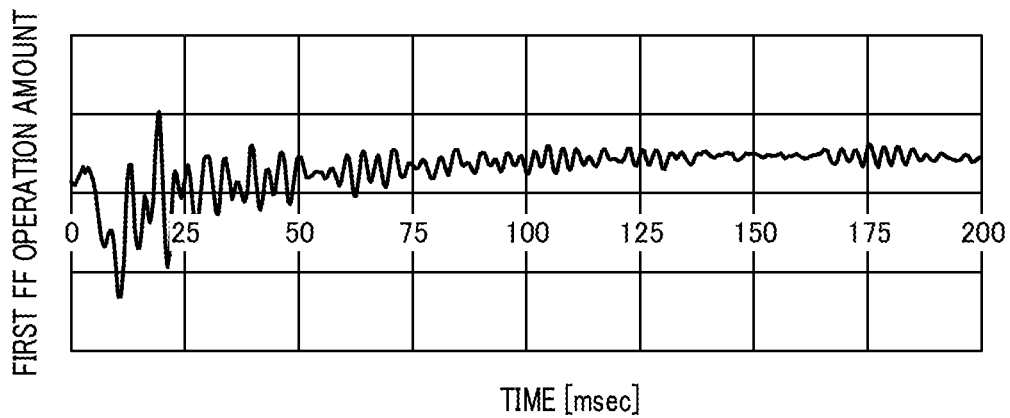
FIG. 11B is a diagram showing the first FF operation amount.
Figure 11C:
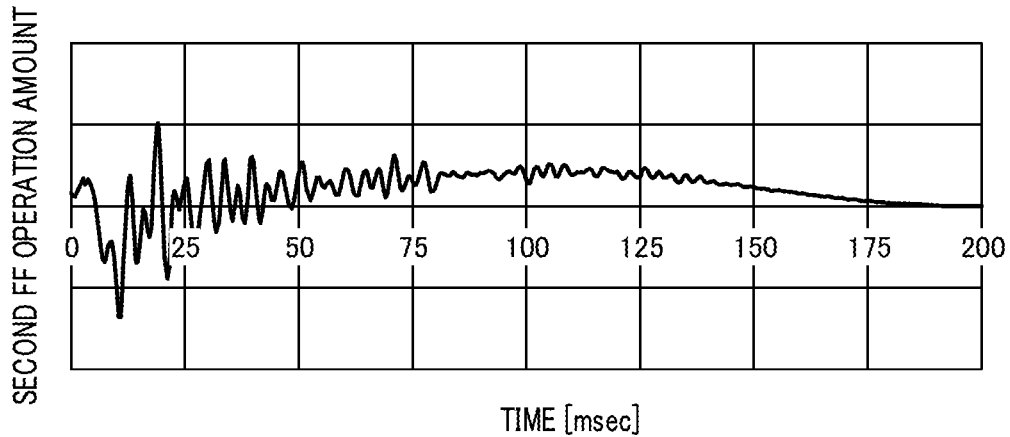
FIG. 11C is a diagram showing a second FF operation amount calculated by multiplying FIG. 11A by FIG. 11B every hour.

FIG. 11A shows the calculated damping amount with the curvature of 1.00 and the damping start point S of 100 msec according to the above-described example. FIG. 11B shows the first FF operation amount. FIG. 11C shows the second FF operation amount calculated by multiplying FIG. 11A by FIG. 11B every hour.

Figure 12A:
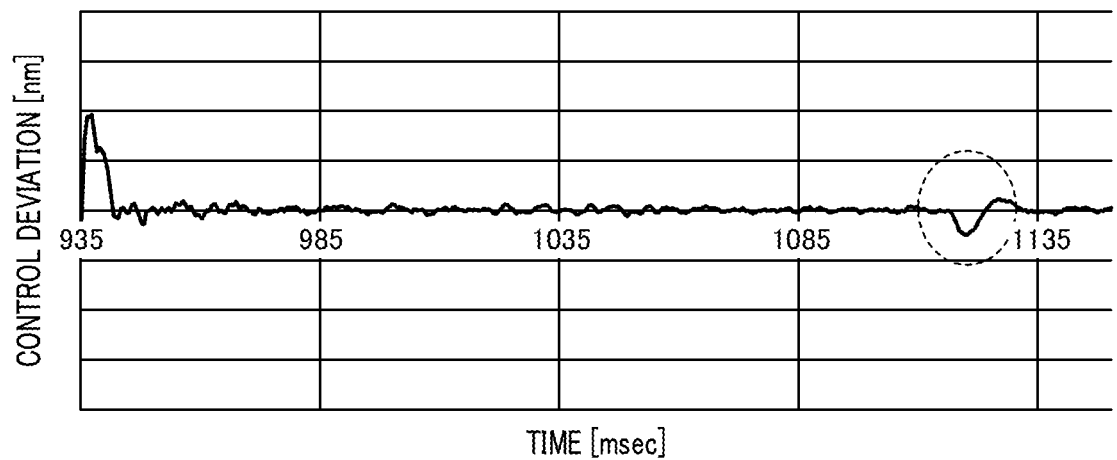
FIG. 12A is a diagram showing the control deviation.
Figure 12B:
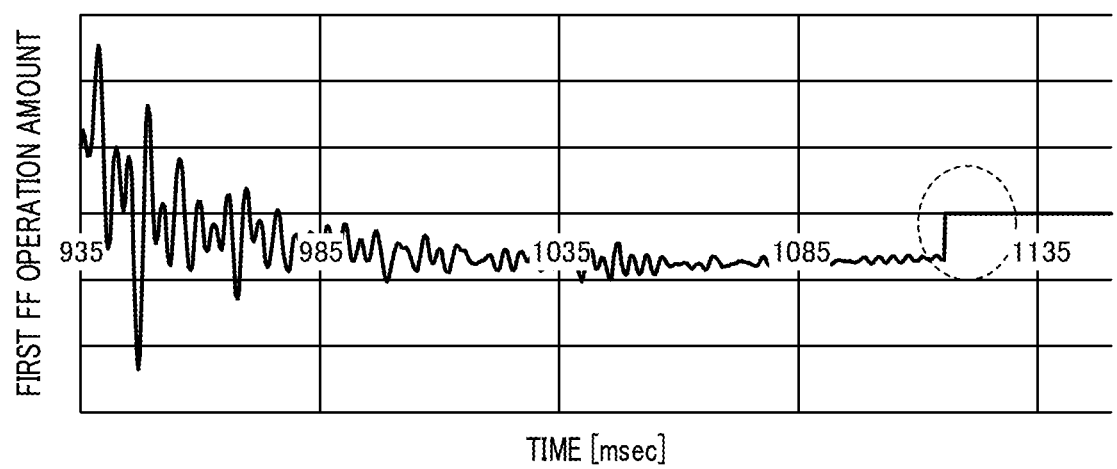
FIG. 12B is a diagram showing the first FF operation amount.

FIG. 12 shows the control deviation when the FF control of the substrate stage is performed using the first FF operation amount and the FF control is stopped, where FIG. 12A shows the control deviation, and FIG. 12B shows the first FF operation amount.

When the FF control is performed using the first FF operation amount and the FF control is stopped, it can be understood that a control deviation slightly larger than that in the FF control state occurs (a dotted circular frame part in FIG. 12).

Figure 13A:
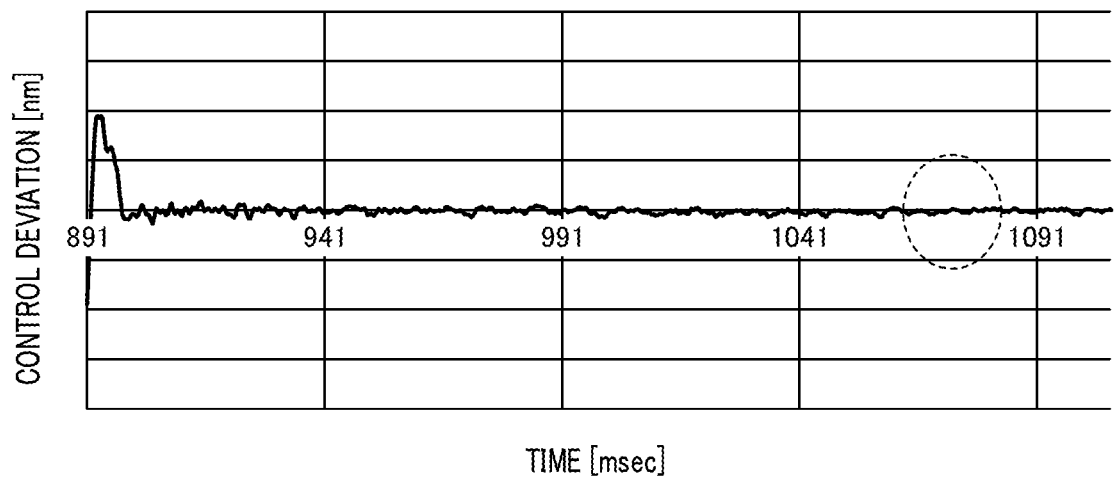
FIG. 13A is a diagram showing the control deviation.
Figure 13B:
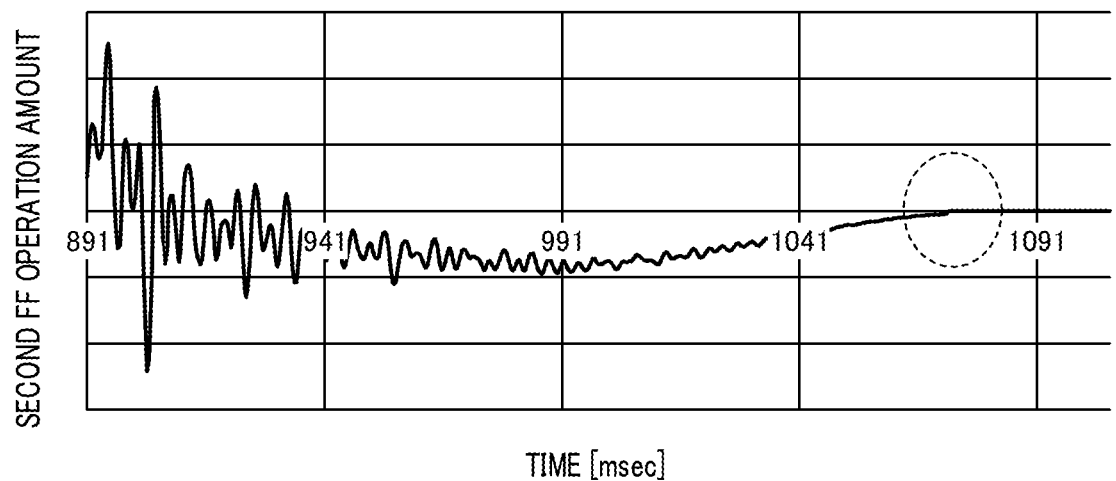
FIG. 13B is a diagram showing the second FF operation amount.

On the other hand, FIG. 13 shows the control deviation when the FF control of the substrate stage is performed using the second FF operation amount and the FF control is stopped, where FIG. 13A shows the control deviation, and FIG. 13B shows the second FF operation amount.

It can be understood that when the FF control is performed using the second FF operation amount, a control deviation equivalent to that when the FF control is performed is exhibited even when the FF control is stopped (a dotted circular frame portion in FIG. 13).

Figure 14:
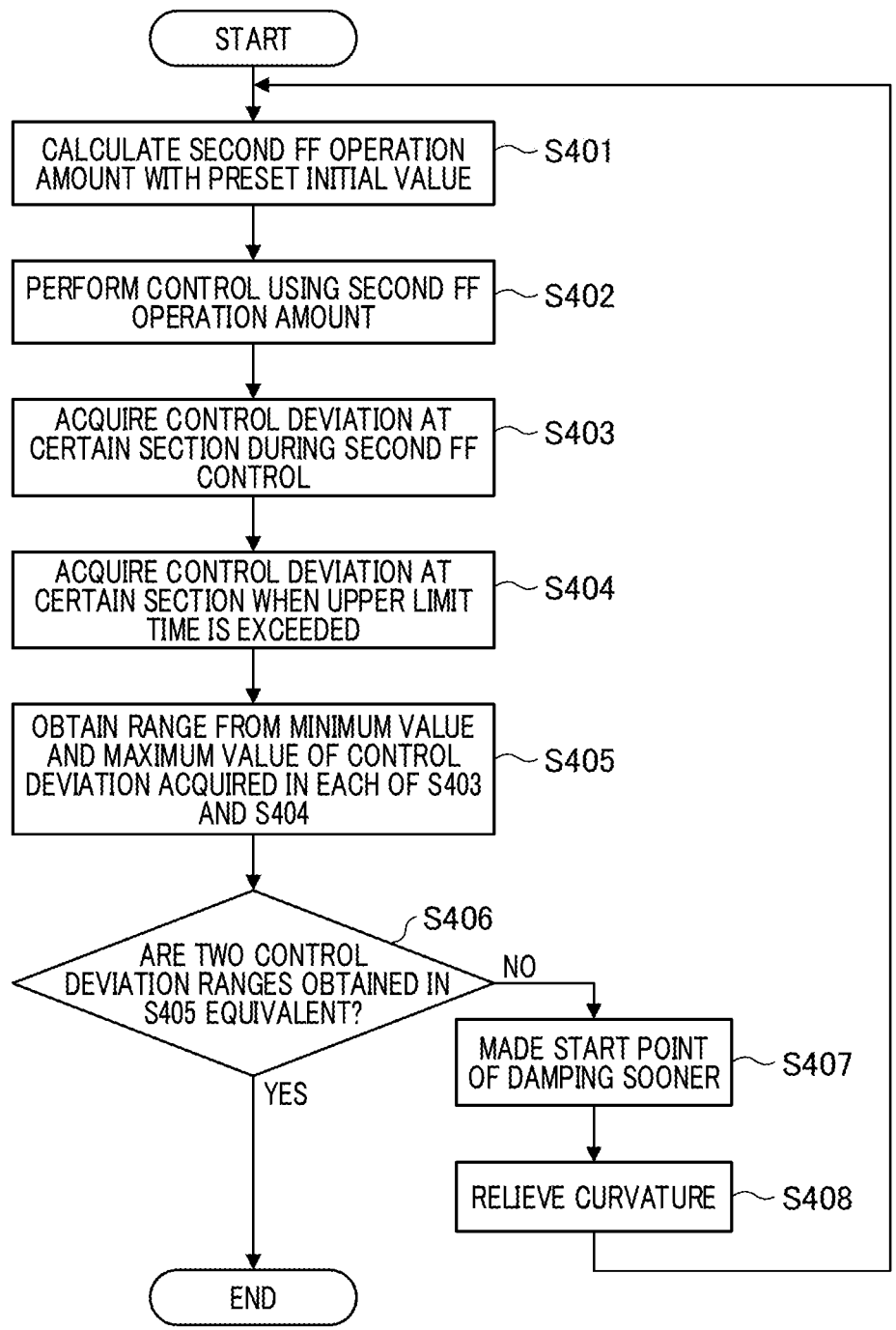
FIG. 14 is a flowchart for automatically determining the start point and the curvature of the damping according to the embodiment.

Next, FIG. 14 shows a method of automatically determining the parameters relating to the damping shown in FIG. 10.

In S401, the second FF operation amount is calculated using a preset initial value of the parameters relating to the damping. In S402, control is performed using the second FF operation amount obtained in S401.

In S403, a control deviation of a predetermined certain section (a first section) of the control target when the control is performed in S402 is acquired. As an example, the control deviation for 10 msec before start of the damping in FIG. 13A is acquired (for example, a section: 981 to 991 msec).

In S404, when the control is performed in S402, the control deviation of a predetermined certain section (a second section) when the upper limit time is exceeded is acquired. As an example, the control deviation for 10 msec from the upper limit time of FIG. 13A (for example, a section: 1071 to 1081 msec) is acquired.

In S405, a minimum value is subtracted from a maximum value of the control deviation in the first section acquired in S403 to obtain a deviation range (a deviation width). Further, a minimum value is subtracted from a maximum value of the control deviation in the second section acquired in S404 to obtain a deviation range (a deviation width).

In S406, the two control deviation ranges obtained in S405 are compared and it is checked whether they are equivalent. As an example of a method of determining whether they are equivalent, it can be checked whether a difference between the two deviation ranges is less than or equal to a threshold value.

When they are equivalent, a flow of automatic determination of the parameters relating to the damping ends, and current parameter settings are maintained.

When they are not equivalent, the damping start point is made sooner in S407. As an example, the damping start point S in FIG. 8 is changed from 180 to 100. Further, in S408, the curvature (the damping rate) is lessened. As an example, the curvature (the curvature coefficient) C in FIG. 9 is changed from 1.5 to 1.0. After S408 ends, the processing returns to S401, and S401 to S408 are repeatedly performed and are repeated until the deviation ranges become equivalent in S406.

In the flow of FIG. 14, the damping start point and the damping rate are changed so that the control deviation is brought within a predetermined range using the second FF operation amount after a predetermined correction for the feedforward operation amount is performed. However, for example, at least one of the damping start point, the damping rate, and the damping amount may be changed.

(Method of Manufacturing Article)

Next, a method of manufacturing an article (a semiconductor IC element, a liquid crystal display element, MEMS, or the like) will be described. The method of manufacturing an article according to the embodiment includes a process of forming a pattern on a substrate (a wafer, glass a substrate, or the like) using the above-described lithographic apparatus (the exposure apparatus), and a process of processing the substrate on which the pattern is formed in the above process. Further, the manufacturing method includes other well-known processes (oxidation, film formation, vapor deposition, doping, planarization, etching, resist stripping, dicing, bonding, packaging, and the like). The method of manufacturing an article according to the embodiment is advantageous in at least one of performance, quality, productivity, and production cost of the article as compared with conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

A part or whole of the control in the embodiment may be provided to the exposure apparatus through a computer program which realizes the function of the above-described embodiment via a network or various storage media. Then, the computer (or a CPU, an MPU, or the like) in the exposure apparatus may read out and execute the program. In that case, the program and the storage medium storing the program constitute the present invention.

This application claims the benefit of Japanese Patent Application No. 2019-170166 filed on Sep. 19, 2019, which is hereby incorporated by reference herein in its entirety.

What is claimed is:

1. A control device for performing position control of a control target by imparting a feedforward operation amount to the control target, comprising:
   at least one processor or circuit configured to function as:
   a determination unit configured to determine whether or not a target time for continuing the control using the feedforward operation amount exceeds a predetermined time, and
   a correction unit configured to correct the feedforward operation amount to be damped toward an end of the target time in a case where it is determined by the determination unit that the target time has exceeded the predetermined time.

2. The control device according to claim 1, wherein the correction unit corrects the feedforward operation amount to be damped according to a length of the feedforward operation amount.

3. The control device according to claim 1, wherein the predetermined time is determined according to an upper limit time during which the control using the feedforward operation amount can be continued.

4. The control device according to claim 1, wherein the correction unit is able to change at least one of a damping start point, a damping rate, and a damping amount of the feedforward operation amount.

5. The control device according to claim 4, wherein the correction unit changes the damping rate by changing a curvature coefficient of a damping function applied to the feedforward operation amount.

6. The control device according to claim 4, wherein the correction unit changes at least one of the damping start point, the damping rate, and the damping amount using the feedforward operation amount after a predetermined correction is performed on the feedforward operation amount so that a control deviation is within a predetermined range.

7. The control device according to claim 1, wherein the feedforward operation amount is obtained by acquiring a measurement result of an output response of the control target when a first operation amount is imparted to the control target and calculating a second operation amount based on a relationship between the first operation amount and the measurement result of the output response.

8. The control device according to claim 7, wherein the second operation amount is determined based on the output response estimated when the second operation amount is imparted to the control target.

9. The control device according to claim 8, wherein the feedforward operation amount is determined based on the second operation amount.

10. A control method of performing position control of a control target by imparting a feedforward operation amount to the control target, the control method comprising:
   determining whether or not a target time for continuing the control using the feedforward operation amount exceeds a predetermined time, and
   correcting the feedforward operation amount to be damped toward an end of the target time in a case where it is determined that the target time has exceeded the predetermined time.

11. A lithographic apparatus for performing position control of a stage by imparting a feedforward operation amount to a stage having a substrate or a stage having a mask, comprising:
   at least one processor or circuit configured to function as:
   a determination unit configured to determine whether or not a target time for continuing the control using the feedforward operation amount exceeds a predetermined time, and
   a correction unit configured to correct the feedforward operation amount to be damped toward an end of the target time in a case where it is determined by the determination unit that the target time has exceeded the predetermined time.

12. The lithographic apparatus according to claim 11, wherein the target time is determined based on at least one of exposure amount and alignment setting.

13. A method of manufacturing an article, comprising:
   forming a pattern of a mask on a substrate using a lithographic apparatus for performing position control of a stage by imparting a feedforward operation amount to a stage having a substrate or a stage having a mask, the lithographic apparatus including at least one processor or circuit which functions as (i) a determination unit configured to determine whether or not a target time for continuing the control using the feedforward operation amount exceeds a predetermined time and (ii) a correction unit configured to correct the feedforward operation amount to be damped toward an end of the target time in a case where it is determined by the determination unit that the target time has exceeded the predetermined time; and
   processing the substrate on which the pattern is formed, wherein an article is manufactured from the processed substrate.

14. A non-transitory computer-readable storage medium that stores a computer program to perform position control of a control target by imparting a feedforward operation amount to the control target,
   wherein the computer program comprises instructions for executing a control method comprising:
   determining whether or not a target time for continuing the control using the feedforward operation amount exceeds a predetermined time, and
   correcting the feedforward operation amount to be damped toward an end of the target time in a case where it is determined that the target time has exceeded the predetermined time.

* * * * *